United States Patent [19]
Visser

[11] Patent Number: 5,963,095
[45] Date of Patent: Oct. 5, 1999

[54] AMPLIFIER CIRCUIT, A TRANSMITTER AND A WIRELESS TELEPHONE

[75] Inventor: Hendrik A. Visser, Eindhoven, Netherlands

[73] Assignee: U.S. Philips Corporation, New York, N.Y.

[21] Appl. No.: 09/019,645

[22] Filed: Feb. 6, 1998

[30] Foreign Application Priority Data

Feb. 7, 1997 [EP] European Pat. Off. ............. 97200341

[51] Int. Cl.⁶ .................................................. H03F 1/08
[52] U.S. Cl. ............................................ 330/293; 330/85
[58] Field of Search .............................. 330/293, 85, 86, 330/292, 294, 262, 271, 273, 274

[56] References Cited

U.S. PATENT DOCUMENTS 3,688,208  8/1972  Kandiah .................................. 330/13
4,481,481  11/1984  Sleeth et al. ........................... 330/296

OTHER PUBLICATIONS

Oswald, IBM Technical Disclosure Bulletin, class B Emitter–Follower, vol. 8, No. 10 Mar. 1996, pp. 1447–1448.

Primary Examiner—Robert Pascal
Assistant Examiner—Henry Choe

[57] ABSTRACT

An amplifier circuit, particularly for RF-purposes includes a main current stream of a controllable RF-semiconductor device having a control input, a control means having a control output coupled to the control input for controlling the main current stream, and a compensation circuit having a compensation output coupled to the control input for compensating the controllable semiconductor device. The compensation circuit is constructed so as to be temporarily active during a period of time wherein the control means do not supply a control output signal to the control input of the controllable semiconductor device. This provides a suitable solution for IC's and for dealing with DC-adjustment disturbances in a low DC-current dissipating manner caused by a lack of pull-down capability when the amplifier circuit operates at very high frequencies or at relatively large amplitudes.

8 Claims, 2 Drawing Sheets

AMPLIFIER CIRCUIT, A TRANSMITTER AND A WIRELESS TELEPHONE

BACKGROUND OF THE INVENTION

The present invention relates to an amplifier circuit, comprising a main current stream of a controllable semiconductor device having a control input, a control means having a control output coupled to the control input for controlling the main current stream, and a compensation circuit having a compensation output coupled to the control input for compensating the controllable semiconductor device.

The present invention further relates to an integrated circuit, a transmitter and a wireless telephone provided with such an amplifier circuit.

Such an amplifier circuit is known from U.S. Pat. No. 4,481,481. The known amplifier circuit comprises a controllable semiconductor device in the form of a common emitter transistor having a control input formed as a base, a control means in the form of an emitter follower transistor having a signal input and having a control output as its emitter, and a compensation circuit in the form of a current mirror having an input connected to the collector of the emitter follower transistor, and having a transistor whose collector is the compensation output which is connected to the base of the common emitter transistor. The amplifier circuit also comprises a DC-current source connected to a terminal of the power supply and to the collector of the emitter follower transistor. A part of the current provided by the current source flows to the collector of the emitter follower transistor and the other part flows through the current mirror. Any rise or fall of an input signal on the signal input of the emitter follower transistor will pull up and pull down, respectively, the base of the common emitter transistor, which functions as a driving stage or end stage, whose available drive is thus maximized. Independently of the state of conduction of the emitter follower transistor, a DC-current will flow at least through the current mirror of the compensation circuit. This causes the compensation circuit in the known amplifier circuit to be permanently active, and which has the drawback of that it exists of a negative effect on the consumption of DC-current from the power supply.

SUMMARY OF THE INVENTION

It is an object of the present invention to obviate this drawback by providing an alternative amplifier circuit having a minimised current consumption, without jeopardizing possible RF-amplification capabilities of the amplifier circuit. To this end, the amplifier circuit according to the invention is characterised in that the compensation circuit is constructed so as to be temporarily active during a period of time wherein the control means do not supply a control output signal to the control input of the controllable semiconductor device.

The amplifier circuit according to the invention has the advantage that the current consumption is reduced because the compensation circuit is only temporarily active during the absence of a control output signal at the control input of the controllable semiconductor device. The compensation circuit is active during a period of time wherein the control input of the controllable semiconductor device is pulled down. During this pull down the input capacity of the controllable semiconductor device is effectively emptied, so that no DC-adjustment disturbances will occur, which disturbances are caused by improperly emptying the input capacity, such as upon amplification of very high frequencies and/or upon amplification of signals having relatively large amplitudes.

In addition, the proposed amplifier circuit according to the invention can easily be integrated on a very small area of an IC, whereas the number of off-chip components is minimised. Another feature which has been added is the reduced current consumption, which makes the amplifier circuit according to the invention even more suitable for applications in transmitter end stages or in transmitters for mobile applications, such as mobile communication devices, mobile telephones, mobile facsimiles and the like, where power consumption takes place from a usually rechargeable battery.

These and other aspects of the invention will be apparent from and elucidated with reference to the embodiments described hereinafter.

BRIEF DESCRIPTION OF THE DRAWINGS

In the drawings.

In the Figures, like reference numerals refer to like parts.

DESCRIPTION OF THE PREFERRED EMBODIMENTS

Figure 1:
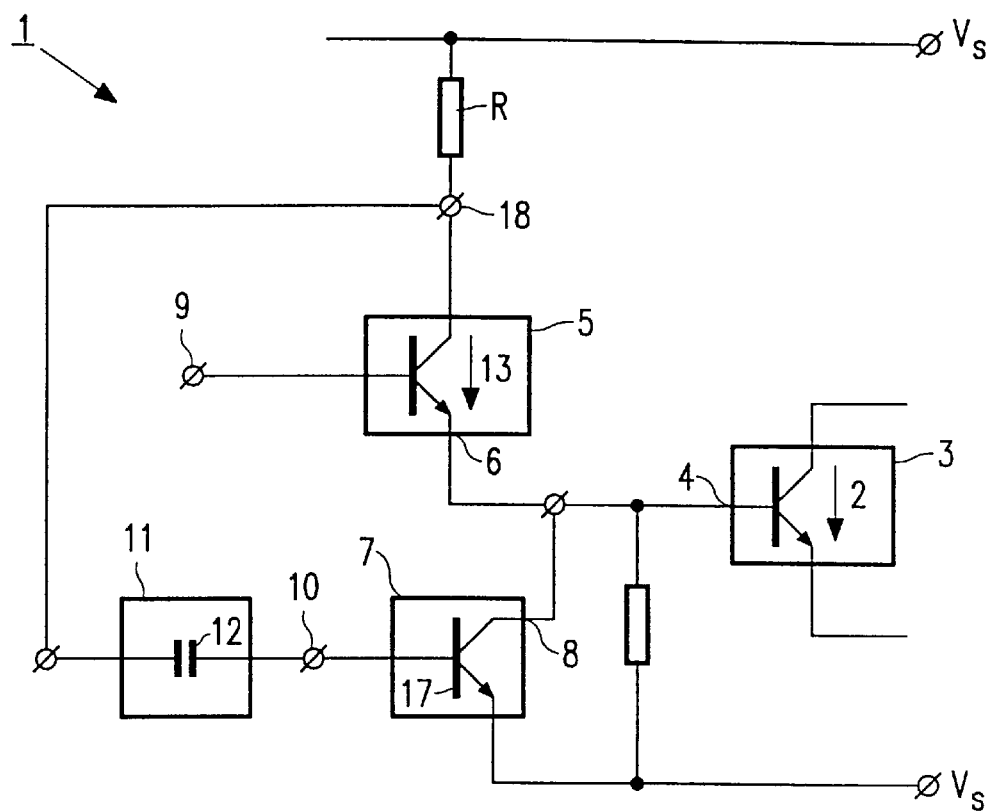
FIG. 1 schematically shows a possible embodiment of the amplifier circuit according to the invention.
Figure 2:
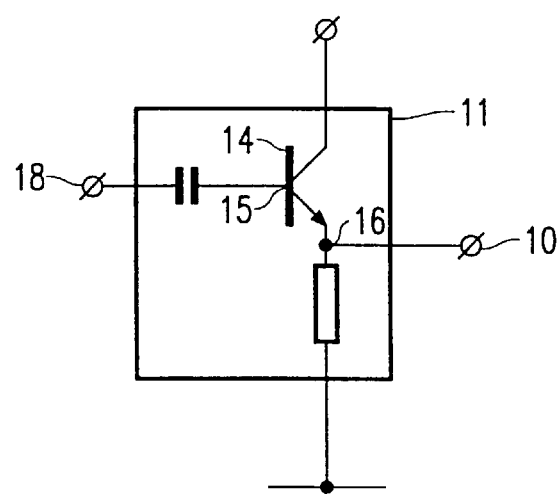
FIG. 2 shows a compensation circuit for use in the amplifier circuit shown in FIG. 1.

FIG. 1 schematically shows an amplifier circuit 1 which is suitable for use in an end stage of a transmitter, wherein large signal components occur at generally high to very high frequencies. The amplifier circuit 1 comprises:—a main current stream 2 of a controllable semiconductor device 3, in particular a controllable RF-semiconductor device, having a control input 4,—a control means 5, having a control output 6 coupled to the control input 4 for controlling the main current stream 2, and—a compensation circuit 7 having a compensation output 8 coupled to the control input 4. For the sake of simplicyty further circuitry for adjusting the DC value in the circuit 1 is not shown in the drawing. The control means 5 are provided with a signal input 9 for inputting signals to be amplified by the circuit 1.

Figure 3:
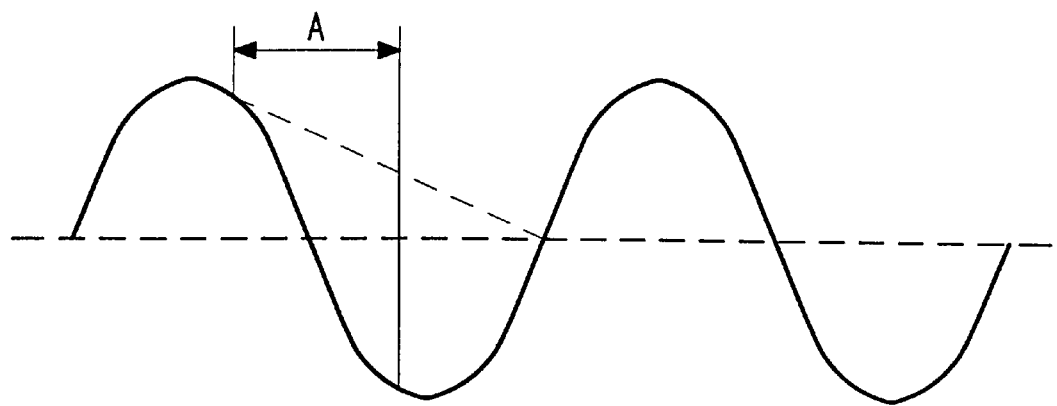
FIG. 3 shows a graph of a control signal, which serves to explain the operation of the embodiments shown in FIGS. 1 and 2.

An example of a control signal at control input 4 is shown in FIG. 3. During pull-up, the positive halves of the control signal give rise to a forced current increase by the control means 5 in the main current stream 2 of the controllable device 3, and the reverse process takes place during the pull-down periods, wherein the current is reduced from the control input 4. If signals are input having high frequencies in the order of for example 450 MHz to 2500 MHz and/or having relatively large amplitudes, parasitic capacities in particular at the control input 4 of the controllable semiconductor device 3 start to play an important role in the amplification process. If during the negative halves of the signal in FIG. 3, the amount of current which is led away or the reduction of the current from the control input 4 of the device 3 is insufficient to discharge the parasitic capacity at control input 4, a situation as indicated by a dotted line in FIG. 3 may occur, wherein the DC-current adjustment is disturbed by a permanent conducting state of the device 3.

This should be precluded by the compensation circuit 7 which serves to compensate the controllable semiconductor device 3 in such a manner that the compensation circuit 7 is temporarily activated, during a period of time A, when the halves of the control signal are decreasing, and the control means 5 do not provide a control output signal to the control input 4 of the controllable semiconductor device 3 and the compensation circuit 7 reduces the discharge current from the parasitic capacity of control input 4 to avoid DC-adjustment disturbance. Thus compensated, the control signal on control input 4 will look like the line shown in FIG. 3.

The compensation circuit 7 is provided with a compensation input 10, which a compensation signal is applied which preferably depends on the control output signal on control output 6 to the controllable semiconductor device 3. The reason for this being that if, in the embodiment as shown, the control means 5 and the compensation means 7 would conduct current simultaneously a near short-circuit could occur. Information about the proper timing for avoiding this short circuit is obtained in the embodiment of FIG. 1 by means of a feedback circuit 11, comprising a frequency-dependent component, here in the form of a capacitor 12. It can be calculated that a proper capacity for amplifying frequencies between 600 MHz and 2400 MHz lies in the order of 100 femto Farad to 3 pico Farad, which is sufficient to open the compensation circuit 7 during the period A, as specified in FIG. 3. The control means 5 have a main current stream 13 and the feedback circuit 11 is connected between this main current stream 13 and the compensation input 10 of the compensation circuit 7. In the embodiment of FIG. 1, the capacitor value is about 3 pF for a 1800 Mhz amplifying signal.

In a further embodiment, the feedback circuit 11 comprises a semiconductor junction in the form of a controllable semiconductor 14 having a control input 15, which is coupled to the main current stream 13 of the control means 5, and having an output 16 coupled to the compensation input 10 of the compensation circuit 7. Also in this case, adjustment circuitry is not shown in the Figure. This embodiment eases the driving of a compensation circuit 7 in the form of a controllable semiconductor 17 as shown, which driving is being derived from a terminal 18 through which the main current stream 13 flows. In this further embodiment the capacity of capacitor 12 can be in the order of 175 fF for a 1800 MHz amplifying frequency. Given the prescribed behaviour of FIG. 3, the capacity of capacitor 12 can be calculated from the frequency, the voltage across feedback resistor R connected between terminal 18 and supply terminal $V_s$, and the current flowing through the capacitor 12.

Figure 4:
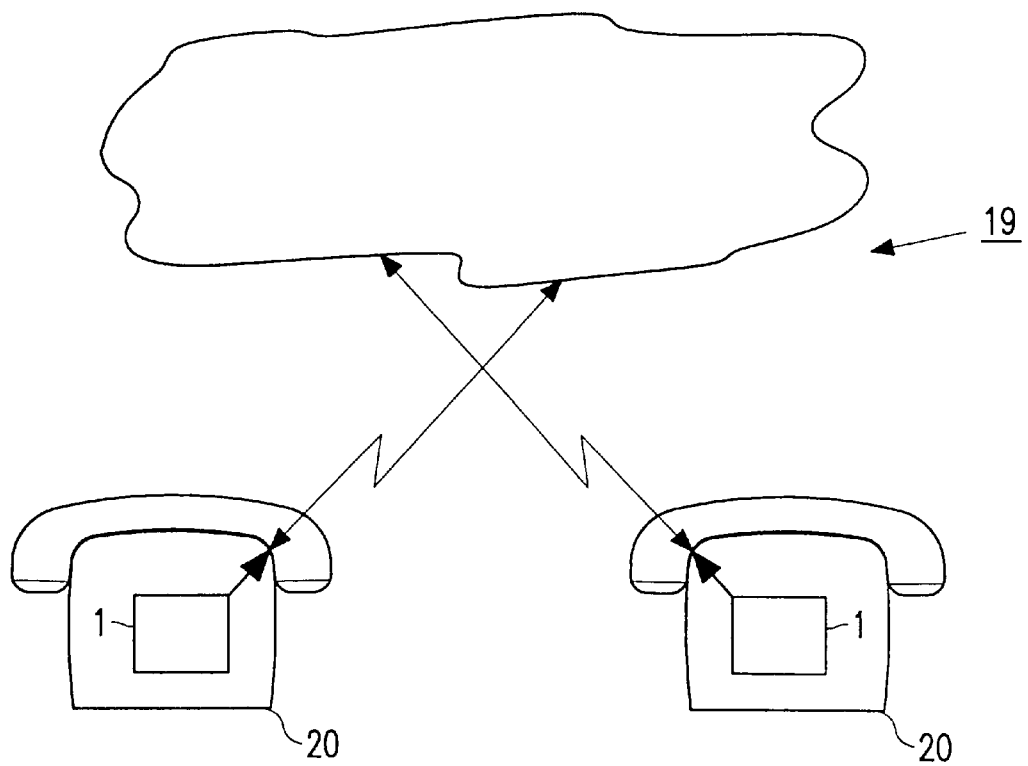
FIG. 4 shows an example of a network with wireless telephones provided with a transmitter having a circuit according to the present invention.

FIG. 4 shows an example of a network 19 comprising schematically shown mobile/portable telephones 20 provided with a transmitter/circuit 1 generally integrated in an IC. Of course, the telephone 20 will comprise all further features necessary for the proper functioning thereof, together with additional features such as hands-free capabilities, listening-in features, dialling features, charging facilities etcetera.

What is claimed is:

1. An amplifier circuit comprising:
   a controllable semiconductor device with a first main current stream and a control input for controlling a current in the first main current stream,
   a control means comprising a semiconductor device with a second main current stream, and a control output coupled to the control input,
   a compensation circuit comprising a compensation input to which a compensation signal is supplied which depends on a control output signal supplied by the control means, and a compensation output coupled to the control input for compensating the first controllable semiconductor device, and
   a feedback circuit coupled between the second main current stream and the compensation input, which feedback circuit comprises a frequency-dependent component, the compensation circuit being temporarily active during a period of time wherein the control means do not supply the control output signal to the control input of the controllable semiconductor device.

2. An amplifier according to claim 1, wherein the frequency-dependent component comprises a capacitor and/or one or more semiconductor junctions.

3. An amplifier according to claim 2, wherein the capacitor has a capacity in the order of 100 fF—3 pF for amplifying frequencies between 450 MHz and 2500 MHz.

4. An amplifier circuit according to claim 1, wherein the feedback circuit comprises a controllable semiconductor device having a control input which is coupled to the second main current stream, and having an output which is coupled to the compensation input.

5. An amplifier circuit according to claim 1, characterised in that the controllable semiconductor device is a controllable RF-semiconductor device.

6. An integrated circuit provided with an amplifier circuit according to claim 1.

7. A transmitter provided with an amplifier circuit according to claim 1.

8. A wireless telephone provided with an amplifier circuit according to claim 1.

* * * * *